United States Patent [19]

MacIver et al.

[11] Patent Number: 4,893,509

[45] Date of Patent: Jan. 16, 1990

[54] METHOD AND PRODUCT FOR FABRICATING A RESONANT-BRIDGE MICROACCELEROMETER

[75] Inventors: Bernard A. MacIver, Lathrup Village; James C. Erskine, Birmingham, both of Mich.

[73] Assignee: General Motors Corporation, Detroit, Mich.

[21] Appl. No.: 291,250

[22] Filed: Dec. 27, 1988

[51] Int. Cl.⁴ ............... H01L 21/306; B44C 1/22; C03C 15/00; C03C 25/06
[52] U.S. Cl. .................. 73/517 AV; 156/628; 156/647; 156/650; 156/657; 156/659.1; 156/662
[58] Field of Search ............ 156/628, 647, 650, 657, 156/659.1, 662; 73/510, 517 R, 517 AV, 726, 754; 357/26; 338/2, 4, 42, 47; 29/621.1

[56] References Cited

U.S. PATENT DOCUMENTS 4,732,647  3/1988  Aine ............................. 156/647 X
4,783,237  11/1988  Aine et al. ..................... 156/647 X

OTHER PUBLICATIONS

Albert, William C., "Vibrating Quartz Crystal Beam Accelerometer," pp. 33–44.
Howe, Roger T. et al., "Integrated Resonant-Microbridge Vapor Sensor," *IEEE Transactions on Electron Devices*, vol. ED-33, no. 4, Apr. 1986, pp. 499–506.
Schmidt, Martin A. et al., "Silicon Resonant Microsensors," *Ceramic Engineering and Science Proceedings, Automotive Materials Conference*, Nov. 19, 1986, pp. 1019–1034.

Primary Examiner—William A. Powell
Attorney, Agent, or Firm—Domenica N. S. Hartman

[57] ABSTRACT

A resonant bridge microaccelerometer is formed using patterned Silicon-on-Insulator (SOI) material. A buried layer is formed in the silicon substrate using preferably oxygen ion implanting techniques. A predetermined proof mass is subsequently formed by selective deposition of an appropriate material on an epitaxially grown layer of silicon generally over the buried layer. The buried layer is subsequently removed by a hydrofluoric acid etch, thereby forming a gap generally everywhere therebetween the proof mass and the supporting silicon substrate, and delineating the resonant microbridges within the microaccelerometer.

14 Claims, 1 Drawing Sheet

METHOD AND PRODUCT FOR FABRICATING A RESONANT-BRIDGE MICROACCELEROMETER

FIELD OF THE INVENTION

This invention relates to sensors of the accelerometer type. More particularly, this invention relates to a method for fabricating a silicon microaccelerometer comprising at least a pair of silicon resonant bridges.

BACKGROUND OF THE INVENTION

An accelerometer is one of the major sensors used in navigational systems, particularly inertial navigational systems, and on-board automotive safety control systems. Automotive examples of accelerometer use include various anti-lock braking systems, active suspension systems, and seat belt lock-up systems.

Generally, in a typical accelerometer, a mass is suspended by two springs attached to opposite sides of the mass. The mass is maintained in a neutral position so long as the system is at rest or is in motion at a constant velocity. When the system undergoes a change in velocity in the direction of the springs' axis, and therefore is accelerated in that direction, the spring mounted mass will at first resist the movement because of its inertia. Therefore, this resistance to the movement or delay, will force one of the springs to be stretched and the second to be compressed. The force acting on each spring is equal, yet opposite, in magnitude and is equal to the product of the weight of the mass and the acceleration of the mass. The acceleration which is determined by the accelerometer is the change in velocity experienced by the mass.

Microaccelerometers having resonant microbridges are known. Examples of this type of accelerometer are disclosed in U.S. Pat. No. 4,805,456 issued Feb. 21, 1989 to Howe et al. entitled, "Resonant Accelerometer," and U.S. Ser. No. 274,180 filed Nov. 21, 1988 to Chang et al. entitled, "Resonant Bridge Two-Axis Microaccelerometer." In a microaccelerometer of this type, a proof mass is suspended by at least one pair of resonant microbridges. The proof mass is generally formed using micromachining techniques. The pair of resonant microbridges are attached to opposite ends of the proof mass along a common axis. This type of resonant microaccelerometer is attractive for precision measurements, because the frequency of a micromechanical resonant structure can be made highly sensitive to physical signals.

In a microaccelerometer based on resonant microbridges, the acceleration in the plane of the substrate causes differential axial loads on oppositely disposed resonant microbridges, i.e., causes one supporting resonant bridge to be in compression and the other in tension. It is the inertial force on the proof mass which generates the axial load on the resonant microbridges. In turn, the compressive and tensile loads shift the inherent resonant frequencies for each resonant microbridge. The difference between the resonant frequencies of the compressive and tensile members is measured and used to determine the magnitude of the acceleration component in the direction of the common axis shared by the pair of resonant microbridges.

It is desirable to provide a method for forming these types of resonant bridge microaccelerometers, in particular without the use of cumbersome and deleterious micromachining techniques, such that the microaccelerometers are reliable, accurate, rugged, and low cost, all characteristics which are required for on-board automotive systems, as well as other applications.

SUMMARY OF THE INVENTION

It is an object of the present invention to provide a method for fabricating a resonant bridge accelerometer.

It is still a further object that such method produce an accelerometer which is rugged, durable and amenable to automotive production techniques.

In accordance with a preferred embodiment of this invention, these and other objects and advantages are accomplished as follows.

An accelerometer of the present invention is fabricated using the following steps. Patterned Silicon-on-Insulator (SOI) is formed in a silicon substrate, preferably using oxygen ion implanting techniques. An epitaxial silicon layer is then grown from the silicon substrate, and over the implanted region, to the appropriate thickness necessary for forming the resonant microbridges. The resonant bridge structures are then photolithographically formed in the epitaxial silicon surface. Next, a layer of silicon dioxide is blanket deposited, preferably using chemical vapor deposition techniques, over the surface. Preferably while the device surface is still planar, the drive and sense electrodes are formed and further protected from subsequent processing steps. Next, the proof mass is delineated by forming a patterned opening in the silicon dioxide mask, and subsequently depositing gold or other appropriate material in the open regions of the silicon dioxide on the exposed epitaxially grown silicon. The buried oxide layer and blanket deposited silicon dioxide are removed by a hydrofluoric acid etch, thereby forming a cavity generally everywhere therebetween the proof mass and the supporting silicon substrate and additionally creating a space between the sense and drive electrodes and the resonant bridge structure.

The resulting accelerometer comprises a proof mass suspended by at least a pair of resonant bridges. A first end of each pair member bridge is attached to opposite sides of the proof mass. The opposite end of each pair member is integrally attached to a common supporting substrate. Therefore, the bridges are integrally attached to both the proof mass and supporting substrate. Members of the bridge pairs are longitudinally aligned with each other to form an axis through opposite sides of the proof mass.

In an illustrative accelerometer which has been fabricated in accordance with this invention, each bridge member is excited to vibrate at its respective resonant frequency. Acceleration of the proof mass and support causes a symmetrical compression and tension in the pair of resonant bridges along a common axis, which results in a change of the inherent resonant frequency for each bridge. This effect correspondingly produces a change in the difference between the resonant frequencies for each member of the bridge pair. The magnitude of this change in difference between resonant frequencies in a bridge pair is measured by a signal processing circuit and corresponds to the acceleration of the proof mass along the axis formed by the respective bridge pair.

A second pair of resonant bridges may be similarly attached to opposite sides of the proof mass, so as to form a second axis which is perpendicular to the axis formed by the first pair of resonant bridges. The acceleration component along the axis formed by the second pair of bridges is then similarly determined. Therefore, the orthogonal components of acceleration are simultaneously measured.

Preferably, the signal processing circuit should include a frequency-measuring circuit for each bridge, most preferably in the form of a single drive electrode and two sense electrodes which are integral with the supporting substrate. The frequency measuring circuit for each bridge is connected to a feedback circuit, which results in an output signal corresponding to the change in difference between frequencies for each respective pair of bridges. From this output, the acceleration undergone by the mass along the axis defined by each bridge pair may be determined.

An inventive feature of this preferred method for forming an accelerometer is that the proof mass is suspended over the supporting substrate so that a cavity exists substantially everywhere therebetween the mass and the substrate, wherein the cavity was formed by the removal of a buried oxide layer rather than using micromachining techniques, such as by etching a cavity from the back side of the wafer using silicon micro-machining techniques. In addition, using this preferred method for forming a microaccelerometer, a displacement stop is inherently provided by the supporting substrate, thereby preventing unnecessary displacement of the proof mass in the direction of the substrate. With this preferred method, the durability and reliability of the resulting accelerometer is greatly enhanced.

Other objects and advantages of this invention will be better appreciated from a detailed description thereof, which follows.

DETAILED DESCRIPTION OF THE INVENTION

A method for forming a resonant bridge microaccelerometer is disclosed which utilizes patterned Silicon-on-Insulator (SOI) material. In summary, patterned SOI is formed in a silicon substrate, preferably using oxygen ion implanting techniques. An epitaxial layer is then grown from the silicon substrate to the appropriate thickness necessary for forming the resonant microbridges. Openings are then formed in the epitaxial silicon layer to delineate the lateral extent of the proof mass and the microbridges. Next, a layer of silicon dioxide is blanket formed on the surface, using preferably either chemical vapor deposition or thermal growth techniques. Preferably while the device surface is still planar, the drive and sense electrodes are formed on or near the microbridges, and also, protected from subsequent processing steps. Next, the proof mass is delineated by forming holes, of the appropriate dimensions which correspond generally to the buried oxide layer, in the silicon dioxide mask layer and subsequently depositing gold or another suitable material on the exposed regions of the epitaxially grown silicon. Lastly, the buried oxide layer and blanket layer of silicon dioxide are removed by a hydrofluoric acid etch, thereby forming a cavity generally everywhere therebetween the proof mass and resonant bridges, and the supporting silicon substrate.

An illustrative example of the microaccelerometer formed in accordance with this preferred method measures the components of acceleration in the plane of the silicon substrate. The microaccelerometer preferably comprises two pairs of polysilicon resonant bridges, which are orthogonally attached to a proof mass. In order to cancel temperature and material effects to first order, the resonant bridge elements which are attached to opposite sides of the proof mass are matched, such that they experience differential axial loads during acceleration. The inertial force on the proof mass, due to acceleration in the plane of the substrate, generates the differential axial loads on the opposing resonant microbridges in each pair thereby shifting their resonant frequencies.

The acceleration component aligned with each microbridge pair is measured by determining the difference in resonant frequencies between each member of the pair. This measurement is accomplished by utilizing drive and sense electrodes positioned on or near their corresponding resonant microbridge.

An inventive feature of this invention is the removal of a buried oxide layer to form the cavity over which the proof mass is suspended. This feature results in the suppression of the displacement of the proof mass in a direction orthogonal to the supporting substrate, since the underlying supporting substrate provides a mechanical stop for movement in that direction. This is a very desirable feature for an accelerometer, since unnecessary orthogonal displacement of the proof mass promotes degradation of the sensor microbridges.

Figure 1:
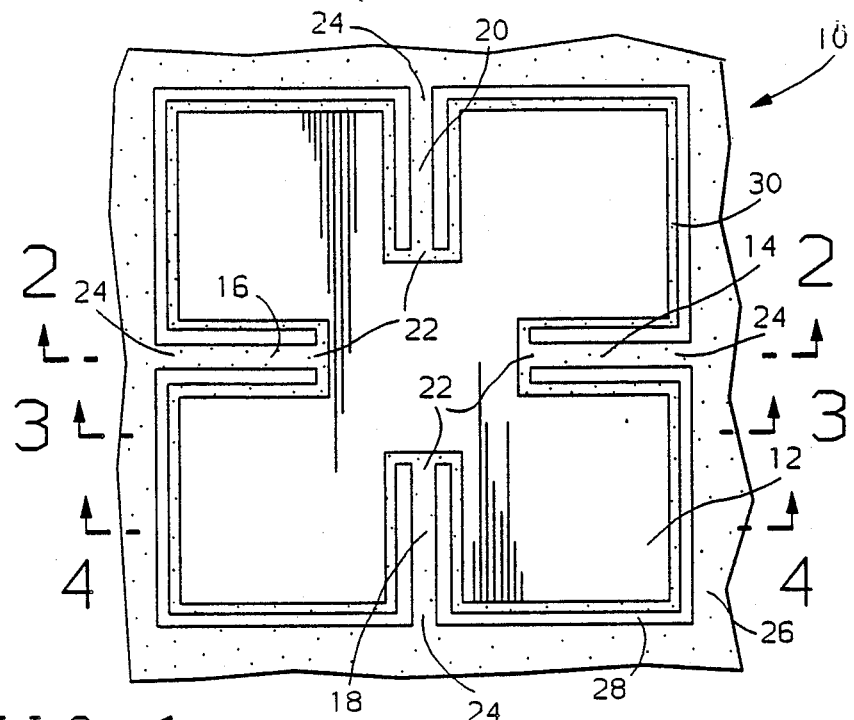
FIG. 1 is a plan view of a resonant bridge two-axis microaccelerometer made in accordance with a preferred embodiment of this invention.

FIG. 1 illustrates a resonant bridge microaccelerometer 10 formed in accordance with the preferred method of this invention. The proof mass 12 is preferably suspended by two pairs of matched resonant bridges (14, 16 and 18, 20), which are sustained in mechanical resonance by means of feedback amplifiers.

The mechanics of the microaccelerometer 10 are not included as part of the inventive subject matter of this patent application, and are described in the previously identified U.S. Ser. No. 274,180. In summary, an x-axis acceleration component, $a_x$, results in an inertial force on the proof mass 12, which is predominantly shared by the resonant bridges aligned in the x-axis direction, which for illustrative purposes are resonant bridges 14 and 16. The acceleration in the x-axis direction causes one of these bridges 14 to be in compression and the other bridge 16 to be in tension, which causes a resulting shift in their resonant frequencies, $f_{x1}$ and $f_{x2}$. Using analytical analysis based on Rayleigh's Energy Method and assuming the fundamental vibrational mode, the x-axis acceleration component may be determined. In addition, this analysis may be used to determine the y-axis component of acceleration also.

The z-axis component of acceleration, which is the axis orthogonal to the plane of the proof mass 12 or the x and y-axis, causes vertical displacement of the proof mass 12. For small vertical displacements, the resulting perturbations for the x- and y-axis acceleration component, are second-order. Therefore, the perturbation is common to both bridges, 14, 16 and 18, 20 aligned with each axis, and is canceled out during analysis. Mechanical restraint on the proof mass 12 is desirable to ensure only small vertical displacements over a practical range of acceleration in the z-axis direction.

As FIG. 1 indicates, a preferred accelerometer 10 of the present invention comprises a proof mass 12 suspended by at least a pair of resonant bridges 14 and 16 or 18 and 20, preferably as shown, wherein two pairs of bridges 14, 16 and 18, 20 are aligned along both orthogonal axes through the proof mass. A cavity 28 is provided generally everywhere therebetween the proof mass 12 and supporting substrate 26. A first end 22 of each pair member bridge is attached to opposite sides of the proof mass 12. The opposite second end 24 of each pair member is attached to a common supporting substrate 26. The bridges 14, 16, 18 and 20 are integrally attached to both the proof mass 12 and supporting substrate 26. Members of the bridge pairs 14, 16 and 18, 20 are longitudinally aligned with each other to form an axis through opposite sides of the proof mass 12

In this illustrative example, the resonant microbridges 14, 16, 18 and 20 are excited to vibrate at their resonant frequencies. Acceleration of the proof mass 12 and supporting substrate 26 causes a symmetrical compression and tension in the pair of resonant bridges 14, 16 and 18, 20 along a common axis, which results in a change of the inherent resonant frequency for each bridge (14, 16, 18 or 20). This effect correspondingly produces a change in the difference between the respective resonant frequencies of each member of the pair of bridges 14, 16 and 18, 20. The magnitude of this change in difference between resonant frequencies in a bridge pair 14, 16 and 18, 20 is measured by a signal processing circuit and corresponds to the acceleration of the proof mass along the axis formed by the respective bridge pair.

The second pair of bridges 18, 20 are not necessary, however, are preferred. The second pair of microbridges are necessary to keep the proof mass from twisting. For the square proof mass configuration, twisting will not occur when the center of gravity of the proof mass is coincident with the plane of the microbridges. Since the proof mass is deposited on top of the silicon, the center of gravity is never coincident with the plane of the microbridges. If the proof mass were long and narrow, twisting could be small and only two microbridges would be required.

Preferably though, orthogonal components of acceleration are simultaneously measured, one component in the direction defined by the first pair of bridges 14, 16 along the x-axis direction, and the other along the y-axis direction formed by the second pair of bridges 18, 20. The signal processing circuit, which is not included in the subject matter of this invention and therefore not shown, preferably includes a frequency-measuring circuit for each bridge, preferably in the form of a single drive electrode which electrostatically excites the resonant bridge to its resonant frequency and two sense electrodes which sense any changes in the time varying capacitance signal corresponding to the vibration of the bridge. The sense electrodes are connected to a feedback circuit (not shown) which causes the drive electrode to exert a force on the bridge (14, 16, 18 or 20) as a function of the sensed change in vibration to maintain vibration of the bridge (14, 16, 18 or 20) at its respective resonant frequency. From this output, the acceleration undergone by the proof mass 12 along the axis defined by each bridge pair 14, 16 and 18, 20 may be determined. The maximum amplitude of the bridge (14, 16, 18 or 20) vibration occurs when the bridge (14, 16, 18 or 20) is at resonance, which is when the frequency of the drive voltage coincides with the natural frequency of the bridge (14, 16, 18 or 20). The drive and sense electrodes may be formed so as to be integral with and formed in the solid silicon supporting substrate 26, or formed so as to be cantilevered above the resonant bridges 14, 16, 18 and 20.

This preferred method for forming a microaccelerometer 10 comprises the following steps. An inventive feature of this invention is that patterned silicon-on-insulator (SOI) is utilized initially. Patterned SOI is first prepared on a single crystal silicon wafer 26 oriented in the (100) plane, by either zone melt recrystallization or more preferably, oxygen ion implanting techniques. Using photolithographic masking techniques, thermally grown silicon dioxide is formed in those regions where ion implantation is not desired. The ion implantation thus occurs in those exposed regions of the silicon substrate 26 and is shaped to correspond to the desired cavity 28 over which the proof mass 12 will be suspended. The silicon dioxide layer is then removed, using conventional techniques, prior to subsequent processing.

If the oxygen ion implant technique is used, an epitaxially grown layer of $n^+$ silicon 30 is grown on the silicon substrate 26, over the implanted layer to a thickness sufficient to form the resonant microbridges 14, 16, 18 and 20. Openings are then cut into the epitaxially grown silicon layer 30, to delineate the lateral extent of the proof mass 12 and the microbridges 14, 16, 18 and 20. As shown in FIG. 1 this delineation corresponds to the cavity region 28. Next, a blanket layer of silicon dioxide is formed on the surface, using preferably thermal growth techniques or chemical vapor deposition. At this point in the fabrication, while the epitaxially grown silicon 30 surface is still planar, the drive and sense electrodes are preferably formed on the substrate 26 and additionally protected from subsequent processing steps.

The proof mass 12 is now formed by first defining its lateral extent and shape in the blanket layer of silicon dioxide mask. The shape of the proof mass 12 will correspond generally to the shape of the underlying oxygen ion implanted region. Gold or another appropriate material is then selectively deposited onto the epitaxially grown silicon layer 30 in that region left unexposed by the silicon dioxide mask. Other appropriate materials may also be deposited so long as the density of the proof mass 12 material is sufficiently high such that its center of gravity is sufficiently similar to the plane of the microbridges 14, 16, 18 and 20 to avoid a large bending moment which could limit the dynamic range of the microaccelerometer 10. In addition, other methods for depositing the proof mass 12 material may be utilized such as electroless plating or evaporation.

Finally, the blanket layer of silicon dioxide and the buried oxygen ion layer are removed by a hydrofluoric acid etch to form the cavity 28 underlying the proof mass 12 and resonant bridges 14, 16, 18 and 20.

This fabrication method for forming an accelerometer 10 is amenable to automotive production techniques, does not limit device performance and reliability and therefore, results in an improved sensor. The proof mass 12 configuration shown in FIG. 1 is preferable since it minimizes the device area and the time required to etch the cavity under the proof mass 12 and the microbridges.

Figure 2:
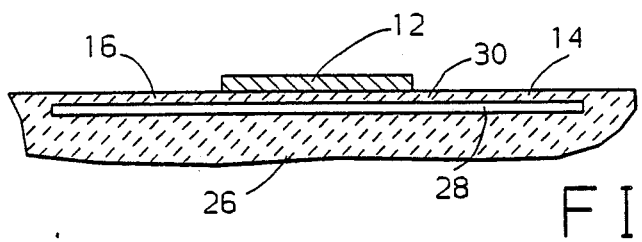
FIG. 2 is a cross-sectional view along the line 2—2 of the microaccelerometer shown in FIG. 1 wherein the proof mass is suspended by two resonant bridges along a single axis, over an underlying cavity.

FIG. 2 is a cross-sectional view of the microaccelerometer 10 shown in FIG. 1 along line 2—2, illustrating the resonant bridges 14 and 16, the proof mass 12, the epitaxially grown layer of silicon 30, the underlying cavity 28 and the silicon substrate 26.

Figure 3:
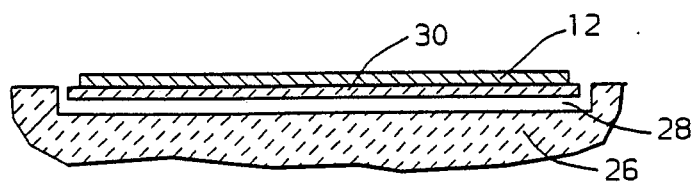
FIG. 3 is a cross-sectional view along the line 3—3 of the microaccelerometer shown in FIG. 1 wherein the proof mass is suspended over an underlying cavity.

FIG. 3 is a cross-sectional view of the microaccelerometer 10 shown in FIG. 1 along line 3—3, illustrating the proof mass 12, the epitaxially grown layer of silicon 30, the underlying cavity 28 and the silicon substrate 26.

Figure 4:
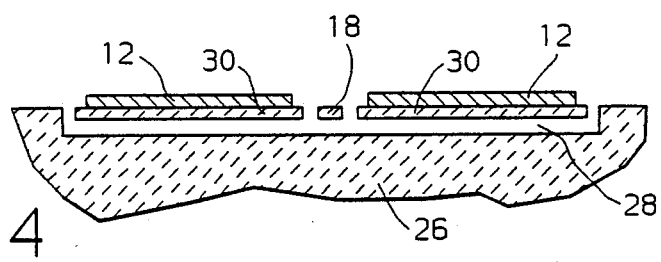
FIG. 4 is a cross-sectional view along the line 4—4 of the microaccelerometer shown in FIG. 1 wherein two regions of the proof mass are suspended over the underlying cavity and a resonant bridge is intermediate to the two regions.

FIG. 4 is a cross-sectional view of the microaccelerometer 10 shown in FIG. 1 along line 4—4, illustrating two regions of the proof mass 12, the epitaxially grown layer of silicon 30, the resonant bridge 18 between the two regions of the proof mass 12, the underlying cavity 28 and the silicon substrate 26.

As indicated by the Figures, the cavity 28 is provided generally everywhere therebetween the proof mass 12 and the silicon substrate 26. In addition, the resonant bridges 14, 16, 18 and 20 span over the cavity 28 and suspend the proof mass 12 over the cavity 28.

Using this preferred method, the microaccelerometer 10 further comprises means for limiting the displacement of the proof mass 12 in a direction orthogonal to the two axes defined by the resonant bridge pairs 14, 16 and 18, 20 through the proof mass 12. In addition, a significant advantage resulting from this preferred method is that the supporting silicon substrate 26 provides a natural stop to the proof mass 12, thereby disposed so as to prevent undesired displacement of the proof mass 12.

Although this invention discloses a preferred method suitable for forming a resonant bridge microaccelerometer, it is to be understood that various modifications and changes may be made in processing and use without departing from the spirit of the invention. For these reasons, these variations are properly considered within the scope of this invention and accordingly the scope of our invention is to be limited only by the following claims.

The embodiments of the invention in which an exclusive property or privilege is claimed are defined as follows:

1. A method for forming an accelerometer comprising the following steps:
   providing a silicon substrate;
   forming a buried layer in said silicon substrate;
   forming a predetermined proof mass of appropriate lateral dimensions on said silicon substrate symmetrically disposed generally over said buried layer;
   removing silicon from said silicon substrate, so as to delineate a pattern which generally corresponds to said lateral dimensions of said predetermined proof mass and so as to delineate a plurality of microbridges; and
   removing said buried layer in said silicon substrate so as to form a cavity generally everywhere therebetween said proof mass and said microbridges, and said silicon substrate.

2. A method for forming an accelerometer as recited in claim 1 wherein an epitaxially grown silicon layer is formed on said silicon substrate after the formation of said buried layer and before the formations of said proof mass.

3. A method for forming an accelerometer as recited in claim 1 wherein a silicon dioxide masking layer is used to delineate the lateral dimensions of said proof mass.

4. A method for forming an accelerometer as recited in claim 1 wherein said predetermined proof mass is formed by the selective deposition of gold.

5. A method for forming an accelerometer as recited in claim 1 wherein said buried layer is removed by a hydrofluoric acid etch.

6. A method for forming an accelerometer comprising the following steps:
   providing a silicon substrate;
   forming a buried layer in said silicon substrate;
   epitaxially growing a silicon layer from said silicon substrate generally over said buried layer;
   removing silicon from said epitaxially grown silicon layer, so as to delineate a pattern which generally corresponds to said lateral dimensions of said predetermined proof mass and so as to delineate a plurality of microbridges;
   forming a layer of silicon dioxide on said epitaxially grown silicon layer and photolithographically delineating said silicon dioxide layer so as to expose at least one region of said epitaxially grown silicon layer;
   forming a predetermined proof mass of appropriate lateral dimensions on said exposed region of said epitaxially grown silicon layer by depositing an appropriate material in those delineated regions of said silicon dioxide layer, said predetermined proof mass being symmetrically disposed generally over said buried layer;
   removing said silicon dioxide layer; and
   removing said buried layer in said silicon substrate so as to form a cavity generally everywhere therebetween said proof mass and said microbridges, and said silicon substrate.

7. A method for forming an accelerometer as recited in claim 6 wherein said epitaxially grown silicon layer comprises n+ silicon.

8. A method for forming an accelerometer as recited in claim 6 wherein said predetermined proof mass is formed by the selective deposition of gold.

9. A method for forming an accelerometer as recited in claim 6 wherein said buried layer is removed by a hydrofluoric acid etch.

10. A method for forming an accelerometer as recited in claim 6 wherein appropriate drive and sense electrodes are formed for each of said bridges.

11. A method for forming an accelerometer comprising the following steps:
    providing a single crystal silicon substrate;
    forming a buried layer in said silicon substrate;
    epitaxially growing a n+ silicon layer from said silicon substrate generally over said buried layer;
    removing silicon from said epitaxially grown silicon layer, so as to delineate a pattern which will generally correspond to the lateral dimensions of a predetermined proof mass and a plurality of microbridges;
    thermally growing a layer of silicon dioxide on said epitaxially grown silicon layer and photolithographically delineating said silicon dioxide layer so as to expose at least one region of said epitaxially grown silicon layer;
    forming a predetermined proof mass comprising gold of appropriate lateral dimensions on said exposed regions of said epitaxially grown silicon layer by depositing an appropriate material in those delineated regions of said silicon dioxide layer, said predetermined proof mass being symmetrically disposed generally over said buried layer;

removing said silicon dioxide layer; and removing said buried layer in said silicon substrate using a hydrofluoric acid etch so as to form a cavity generally everywhere therebetween said proof mass and said microbridges, and said silicon substrate.

12. A method for forming an accelerometer as recited in claim 11 wherein appropriate drive and sense electrodes are formed corresponding to each of said bridges.

13. A microaccelerometer formed in accordance with claim 1 comprising:

a mass;

a substrate surrounding said mass with a cavity provided generally everywhere therebetween said substrate and said mass; and at least two bridges attached at one end to said substrate from which said mass is suspended, said bridges being attached to opposite sides of said mass such that the longitudinal axis through said bridges form a common axis through said mass.

14. A microaccelerometer formed in accordance with claim 13 further comprising drive and sense electrodes corresponding to each of said bridges.

* * * * *